United States Patent
Tsuno et al.

(10) Patent No.: US 8,907,279 B2
(45) Date of Patent: Dec. 9, 2014

(54) ELECTRON MICROSCOPE AND IMAGE CAPTURING METHOD USING ELECTRON BEAM

(75) Inventors: Natsuki Tsuno, Tokyo (JP); Hideyuki Kazumi, Tokyo (JP); Yuzuru Mochizuki, Tokyo (JP); Takafumi Miwa, Tokyo (JP); Yoshinobu Kimura, Tokyo (JP); Toshiyuki Yokosuka, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/123,744

(22) PCT Filed: May 24, 2012

(86) PCT No.: PCT/JP2012/063320
§ 371 (c)(1),
(2), (4) Date: Dec. 3, 2013

(87) PCT Pub. No.: WO2012/165293
PCT Pub. Date: Dec. 6, 2012

(65) Prior Publication Data
US 2014/0097342 A1    Apr. 10, 2014

(30) Foreign Application Priority Data
Jun. 3, 2011 (JP) ................. 2011-125475

(51) Int. Cl.
*H01J 37/26* (2006.01)
*G01B 15/04* (2006.01)
*H01J 37/28* (2006.01)

(52) U.S. Cl.
CPC ............... *H01J 37/265* (2013.01); *G01B 15/04* (2013.01); *H01J 2237/2803* (2013.01); *H01J 2237/24585* (2013.01); *H01J 37/28* (2013.01)

USPC ............................ 250/307; 250/310; 250/311

(58) Field of Classification Search
USPC ......................................... 250/307, 310, 311
See application file for complete search history.

(56) References Cited

U.S. PATENT DOCUMENTS

| 2004/0026633 A1 | 2/2004 | Gunji et al. |
| 2005/0045820 A1* | 3/2005 | Ohshima et al. ............... 250/310 |

FOREIGN PATENT DOCUMENTS

| JP | 58-197643 A | 11/1983 |
| JP | 2-295043 A | 12/1990 |

(Continued)

OTHER PUBLICATIONS

W.K. Wong et al, "Charging Control Using Pulsed Scanning Electron Microscopy," Scanning, vol. 17, pp. 312-315, (1995).

(Continued)

*Primary Examiner* — Nikita Wells
*Assistant Examiner* — Meenakshi Sahu
(74) *Attorney, Agent, or Firm* — Miles & Stockbridge P.C.

(57) ABSTRACT

The present invention is characterized by an electron microscope which intermittently applies an electron beam to a sample and detects a secondary electron signal, wherein an arbitrarily defined detection time (T2) shorter than the pulse width (Tp) of the applied electron beam is selected, and a secondary electron image is formed using the secondary electron signal acquired during the detection time. Consequently, it is possible to reflect necessary sample information including the internal structure and laminated interface of the sample in the contrast of an image and prevent unnecessary information from being superimposed on the image, thereby making it possible to obtain the secondary electron image with improved sample information selectivity and image quality.

19 Claims, 14 Drawing Sheets

(56) References Cited

FOREIGN PATENT DOCUMENTS

| JP | 2004-31379 A | 1/2004 |
|----|--------------|--------|
| JP | 2005-71775 A | 3/2005 |

OTHER PUBLICATIONS

S. Gorlich et al., "Capacitive Coupling Voltage Contrast," Scanning Electron Microscopy, vol. II, pp. 447-464 (1986).

* cited by examiner

DIRECTION OF
ELECTRIC FIELD

US 8,907,279 B2

ELECTRON MICROSCOPE AND IMAGE CAPTURING METHOD USING ELECTRON BEAM

TECHNICAL FIELD

The present invention concerns an electron microscope for observing the shape of a sample using an electron beam, and particularly relates to a technology for observing an internal structure and an interface state of the sample.

BACKGROUND ART

There is an electron microscope using electron beam as a microscope which allows magnified observation of a sample and it is utilized in observation of the detailed shape of the surface of the sample and the composition thereof. A scanning electron microscope (hereinafter, referred to as SEM) focuses an electron beam which has been accelerated by a voltage applied to an electron source by an electron lens, and scans the focused electron beam (a primary electron) on a sample by a reflector. An electron (a secondary electron) which has been emitted from the sample by being irradiated with the primary electron is detected by a detector. A secondary electron signal is detected in synchronization with a scanning signal to configure a two-dimensional image. Since the secondary electron yield emitted from the sample is made different in accordance with the shape of the sample surface, a difference is generated between detection signals and a contrast reflecting the shape can be obtained. In the SEM, observation of a fine surface shape is the most common application.

Recently, cases that a sample which is configured by an insulator or an insulator and a conductor becomes an observing object of the SEM have been increased. In a case where the object is the insulator, an image disturbance such as an image drift, a loss of shape contrast or the like during observation becomes a problem. This disturbance occurs because a voltage contrast which is generated by influence of electrical charging by electron beam irradiation on a detection amount of the secondary electrons is superimposed on the shape contrast. For the purpose of reducing the influence of the voltage contrast caused by the aforementioned electrical charging, a technique of performing imaging by controlling the number of electrons to be irradiated by pulsed the electron beams is disclosed in Non-Patent Literature 1. In Patent Literature 1, as a general technique of intermittently irradiating and pulsing an electron beam, a system of using a blanking electrode and a blanking slit is disclosed. In Patent Literature 2, an image capturing method of detecting a secondary electron by pulsed electron irradiation and configuring a two-dimensional image by a secondary electron signal from each irradiation position is disclosed. In Patent Literature 3, a method of irradiating the same place with a pulsed electron a plurality of times at predetermined time intervals to image it is disclosed.

CITATION LIST

Patent Literature

Patent Literature 1: Japanese Patent Application Laid-Open No. 2005-71775
Patent Literature 2: Japanese Patent Application laid-Open No. Sho58-197643
Patent Literature 3: Japanese Patent Application Laid-Open No. 2004-31379

Non Patent Literature

Non Patent Literature 1: W. K. Wong, J. C. H. Phang, J. T. L Thong, SCANNING, Vol. 17, 312-315 (1995)
Non Patent Literature 2: S. Gorlich and K. D. Herrmann, W. Reiners, E. Kubalek, Scanning Electron Microscopy, Vol. 11, 1966

SUMMARY OF INVENTION

Technical Problem

The voltage contrast which is generated by influence of the aforementioned electrical charging on the detection amount of the secondary electrons is an unnecessary contrast when the surface shape of a sample which is configured by a single material is to be observed. On the other hand, it is empirically known that information which is different from the surface shape is superimposed on an image when a sample having a laminate structure configured by a plurality of materials is observed. The amount of electrification charges under electron beam irradiation which is reflected on the voltage contrast depends on electric characteristics such as the capacitance, the resistance and so forth of the sample (see Non Patent Literature 2). Further, the aforementioned electric characteristics reflect an embedded structure and an interface of a laminate structure. That is, if the voltage contrast concerned could be extracted, observation and diagnosis of the embedded structure and the interface of the laminate structure will become possible.

However, the voltage contrast caused by the electrical charging concerned appears and disappears during observation. This is because the electrification charges repeat accumulation and relaxation depending on the time. In a conventional observation method using a pulsed electron beam, all secondary electron signals included in an irradiation time are detected. Consequently, because even a secondary electron signal having no necessary sample information is also integrated, the contrast of the image is weakened or unnecessary sample information is superimposed on the image, and therefore there is such a problem that image analysis becomes difficult.

An object of the present invention is to provide an image capturing method and a scanning electron microscope using pulsed electron beam for improving image quality and selectivity of sample information by solving the above-mentioned problem.

Solution to Problem

A time change of a secondary electron signal will be described by giving observation of an embedded structure as an example. FIG. 1A is a sectional diagram of a sample used in an experiment. The aforementioned sample 1 is configured by a region A of a silicon oxide film 2 and a region B that polysilicon 3 is embedded in the silicon oxide film. FIG. 1B is a result of acquisition of a transient response of the secondary electron signal under pulsed electron irradiation, and the time changes of the secondary electron signal in the region A and the region B in irradiation of a pulsed electron having a pulse width of 0.5 ms.

The secondary electron signal exhibits a pulse shape of 0.5 ms which is the same as the pulse width for radiation. The secondary electron signal attenuates during pulsed electron irradiation and is made steady. When the number of emitted secondary electrons is larger than the number of irradiated electrons, the surface of the sample is positively charged. Emission of the secondary electrons from the sample is attenuated by this positive charging, and as a result it is made steady in a state that the number of irradiated electrons becomes equal to the number of emitted secondary electrons. As apparent from FIG. 1B, there is almost no difference in secondary electron signal between the region A and the region B immediately after starting irradiation that the irradiation time is not more than 0.01 ms and when it is at least 0.4 ms that the signal of the secondary electron is made steady.

On the other hand, in a range from 0.1 ms to 0.3 ms, the difference in secondary electron signal between the region A and the region B is increased. That is, an image that reflects the embedded structure appears in a specific time-domain that the difference is generated in secondary electron signal.

The invention of the present application has been made on the basis of a study relating to the transient response of such a secondary electron signal, and an observation method using pulsed electron beam according to the present invention is featured by including the step of controlling a detection timing and a detection time in detection of the secondary electron. According to this method, a time-domain that the secondary electron signal is to be detected during pulsed electron irradiation can be selected. As shown in FIG. 1B, sample information appears in a specific time domain during irradiation. Since a secondary electron signal not having necessary sample information and a secondary electron signal including unnecessary information can be removed by selecting the time-domain for detection of the secondary electron, image quality improvement can be expected.

In addition, the observation method using pulsed electron beam of the invention of the present application is featured by including the step of irradiating the same place with a plurality of pulsed electrons, and the step of synchronizing a timing for detecting the secondary electron with one or more pulsed electrons in the plurality of pulsed electrons. The sample information appears with a specific pulsed electron irradiation frequency. According to this method, since the signal of the secondary electron from a pulsed electron having necessary information can be selectively acquired, improvement in information selectivity can be expected in addition to image quality.

In addition, the observation method using pulsed electron beam of the invention of the present application is featured by including the step of irradiating the same place with a plurality of pulsed electrons under different intermittent conditions, and the step of synchronizing a timing for detecting the secondary electron with at least one or more conditions of pulsed electrons within the different intermittent conditions. The sample information appears in a process that a state which has been induced by irradiation is relaxed. According to this method, since an electron irradiation process for inducing the state and electron irradiation used for imaging can be cut apart, image quality improvement can be expected.

Here, in the different intermittent conditions, a first intermittent condition is an intermittent condition that the sample is subjected to electrical charge processing by electron irradiation, a second intermittent condition is an intermittent condition that electrical charging of the sample is detected, and the intermittent condition which synchronizes with the detection time is the aforementioned second intermittent condition. According to this method, the sample information reflecting the embedded structure and the interface state of the sample can be selected as the necessary sample information.

Here, the aforementioned first intermittent, condition is a condition for irradiation of 100 to 10000 electrons in number, the aforementioned second intermittent condition is an intermittent condition for irradiation of 1 to 100 electrons in number, and an interval between the first intermittent condition and the second intermittent condition is 0.001 ms to 1000 ms.

Here, the aforementioned second intermittent condition is a condition that the same place is irradiated a plurality of times, and it is featured by including the step of integrating and imaging the detection signals of the secondary electrons acquired in synchronization with the second intermittent condition. According to this method, image quality improvement by signal integration can be expected.

In addition, the observation method using pulsed electron beam of the invention of the present application is featured by including the step of selecting at least two or more intermittent conditions when the same place is to be irradiated with a plurality of pulses under different intermittent conditions having different irradiation frequencies, pulse widths and inter-pulse interval times, and synchronizing the timing for detecting the secondary electron with the selected intermittent condition, and the step of imaging synchronously detected secondary electrons for each selected intermittent condition. According to this method, since a plurality of pieces of sample information can be visualized by one sequence, improvement in sample analysis efficiency can be expected.

Here, a first intermittent condition is a condition for reflecting a surface shape, a second intermittent condition is a condition for processing electrical charging of the sample, a third intermittent condition is a condition for controlling electrical charging, and the selected conditions which synchronize with detection are the first and third intermittent conditions. Owing to this setting, images reflecting the sample surface shape and the internal structure can be simultaneously analyzed.

In addition, the observation method using pulsed electron beam of the invention of the present application is featured by including the step of changing an interval at which the first and second intermittent conditions are executed in case of irradiating the same place with the pulsed electrons under the first intermittent condition and the second intermittent condition, and the step of changing the detection timing of the secondary electron in synchronization with a change in the aforementioned interval. According to this method, a relaxation process of a state induced under the first intermittent condition, can be observed in time resolution.

Here, incident energy of the intermittent electron beam is 1 eV to 3000 eV.

In addition, the observation method using pulsed, electron beam of the invention of the present application is featured by including the step of setting the pulsed electron intermittent condition and the secondary election detection condition on the basis of the transient characteristics of the secondary electron. According to this method, a favorable observation condition can be set in a short time.

A scanning electron microscopic device using electron beam of the invention of the present application has a means for emitting an electron beam, a means for intermittently pulse-irradiating the electron beam, a means for controlling an intermittent condition of the aforementioned electron beam, a means for positioning an irradiation position of the aforementioned electron beam, a means for focusing the aforementioned electron beam onto a sample, a means for detecting a secondary electron from the aforementioned sample, a means for controlling a detection timing and a detection time of the aforementioned secondary electron, a means for forming an image from a detection signal of the aforementioned secondary electron and the aforementioned irradiation position, and a means for displaying the aforementioned image.

In addition, a scanning electron microscopic device using electron beam of the invention of the present application includes a means for emitting an electron beam, a means for intermittently pulse-irradiating the electron beam, a means for controlling an intermittent condition of the aforementioned electron beam, a means for positioning an irradiation position of the aforementioned electron beam, a means for focusing the aforementioned electron beam onto a sample, a means for detecting a secondary electron from the aforementioned sample, a means for selecting a pulse for detecting the aforementioned secondary electron, a means for forming an image from a detection signal of the aforementioned secondary electron and the aforementioned irradiation position, and a means for displaying the aforementioned image.

Advantageous Effects of Invention

According to the invention of the present application, since a signal having necessary information can be selectively detected by controlling the detection time-domain of the secondary electron signal, observation and analysis of the sample shape which is high in image quality and high in information selectivity becomes possible.

DESCRIPTION OF EMBODIMENTS

In the following, embodiments of the present invention will be described using drawings.

Embodiment 1

In this embodiment, image capturing method and device in single pulse irradiation to the same place will be described.

Figure 2:
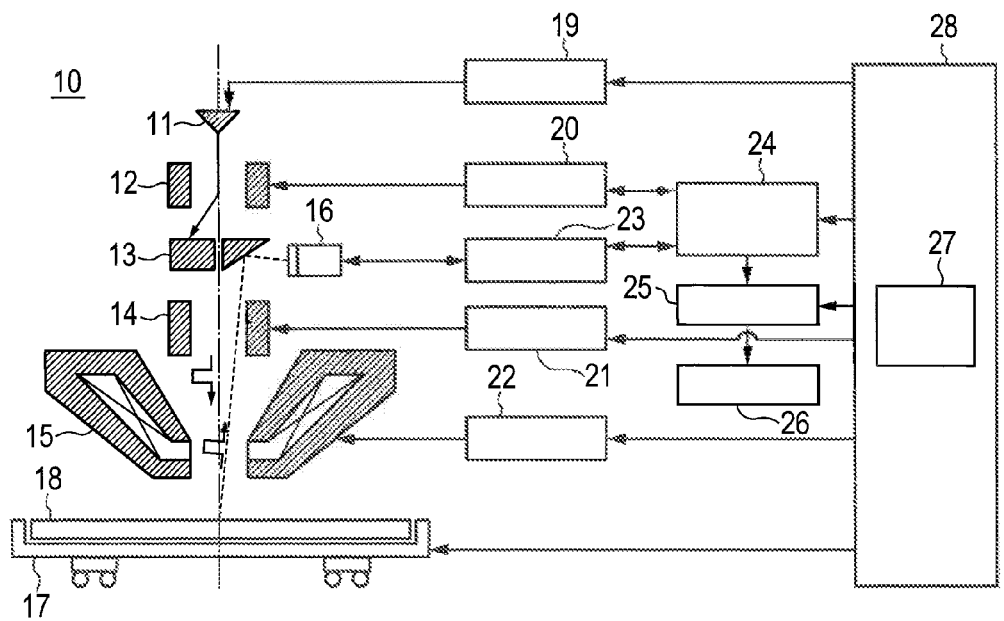
FIG. 2 is a configuration diagram showing one example of an electron microscope of the present invention.

A configuration example of a scanning electron microscope in the present invention is shown in FIG. 2. A scanning electron microscope 10 is configured by an electron optical system, a stage mechanism system, a control system, an image processing system, and an operation system. The electron optical system is configured by an electron gun 11, a pulse generator 12, an aperture 13, a deflector 14, an objective lens 15, and a detector 16. The stage mechanism system is configured by a sample holder 17 on an XYZ stage and a sample 18. The control system is configured by an electron gun control unit 19, a pulse control unit 20, a deflection scanning signal control unit 21, an objective lens coil control unit 22, and a detector control unit 23. The image processing system is configured by a detection signal processing unit 24, an image forming unit 25, and an image display unit 26. The operation system is configured by an operation interface 27 and an SEM control unit 28. Although the invention of the present application is of a configuration that the pulse generator 12 is separately installed, it can be also implemented even by using an electron gun capable of irradiating an electron beam in a pulsed state. In this case, it is also possible to incorporate the pulse control unit into the electron gun control unit.

Figure 1A:
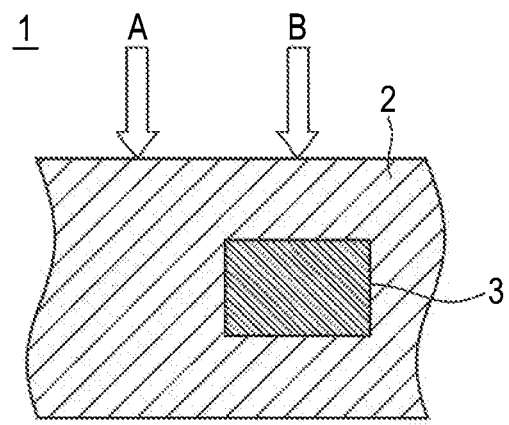
FIG. 1A is a sectional diagram of a sample to be used in an embodiment 1.
Figure 1B:
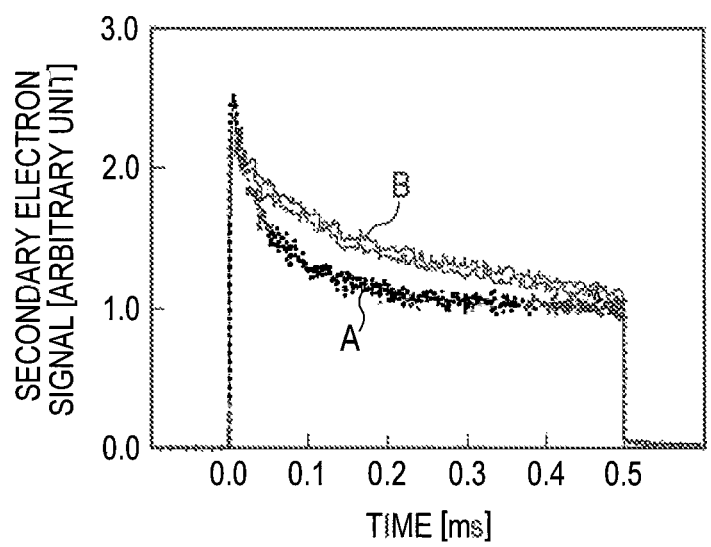
FIG. 1B is an explanatory diagram showing a time change of a secondary electron signal.

In a case where a pulsed electron of 0.5 ms has been irradiated as shown in FIG. 1B, a difference is generated between secondary electron signals at a position A and a position B in FIG. 1A in a range from 0.1 ms to 0.3 ms. Thus, in order to obtain a contrast between the positions A and B, it is necessary to integrate secondary electron signals of 0.1 ms to 0.3 ms.

Figure 3A:
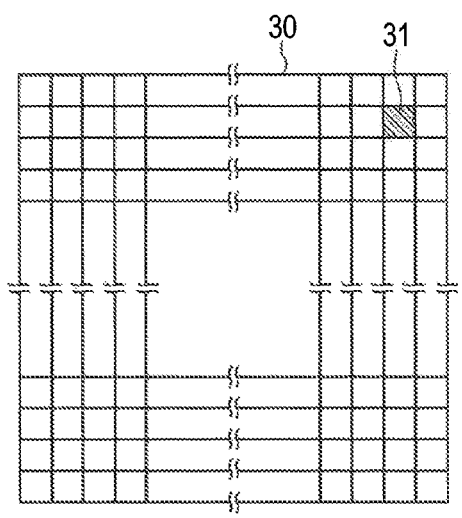
FIG. 3A is an explanatory diagram relating to image formation of SEM.
Figure 3B:
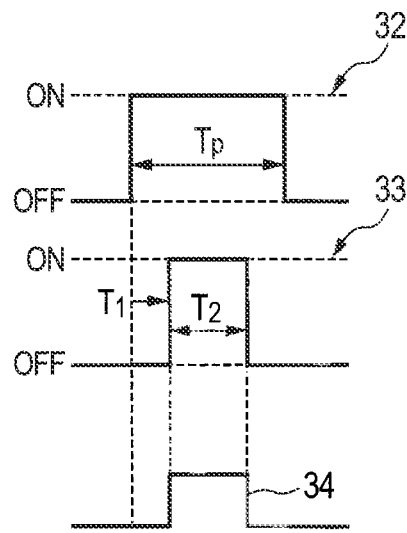
FIG. 3B is an explanatory diagram showing one example of an image capturing method of the embodiment 1.

An image capturing method under pulsed electron beam irradiation in the present embodiment is shown in FIGS. 3A and 3B. FIG. 3A is the one explaining image formation of SEM. A secondary electron signal from an irradiation position controlled by the aforementioned deflector 14 is detected to be used as brightness of a pixel 31. While changing the aforementioned irradiation position, the secondary electron signal is detected. An image is formed from the coordinates of the aforementioned irradiation position and the intensity of the secondary electron signal, in the present embodiment, the same place is defined by the same pixel. FIG. 3B shows a relation among a time chart 32 for an intermittent condition of a pulsed electron to be irradiated to the same pixel, a time chart 33 for detector control and a signal waveform 34 of a secondary electron obtained at that time. The intermittent condition in the present embodiment is a pulse width. As shown in the time chart 32, the pulsed electron is intermittently irradiated to the single pixel with a pulse width $T_p$ the aforementioned pulse control unit 20. A secondary electron during pulsed electron irradiation is detected at a timing $T_1$ and a detection time $T_2$ as shown in the time chart 33 for the aforementioned detector control and the signal waveform 34 of the aforementioned secondary electron is obtained.

In a case where the sample in FIG. 1A is to be observed, it is desirable that the pulse width $T_p$ be 0.5 ms, the timing $T_1$ be 0.1 ms and the detection time $T_2$ be 0.2 ms. Although the present embodiment is of a configuration that the detection timing and the detection time are controlled by the detector control unit 23, all secondary electron signals included in an irradiation time may be acquired and the secondary electron signals included in the aforementioned time-domain may be cut out in data processing by the detection signal processing unit 24.

A result of observation performed on the sample in FIG. 1A with incident energy of 0.300 eV of the electron beam using the image capturing method under irradiation of the pulsed electron beam concerned is shown in FIG. 43. In general, a depth which can be visualized with 300 eV is about 10 nm.

Figure 4A:
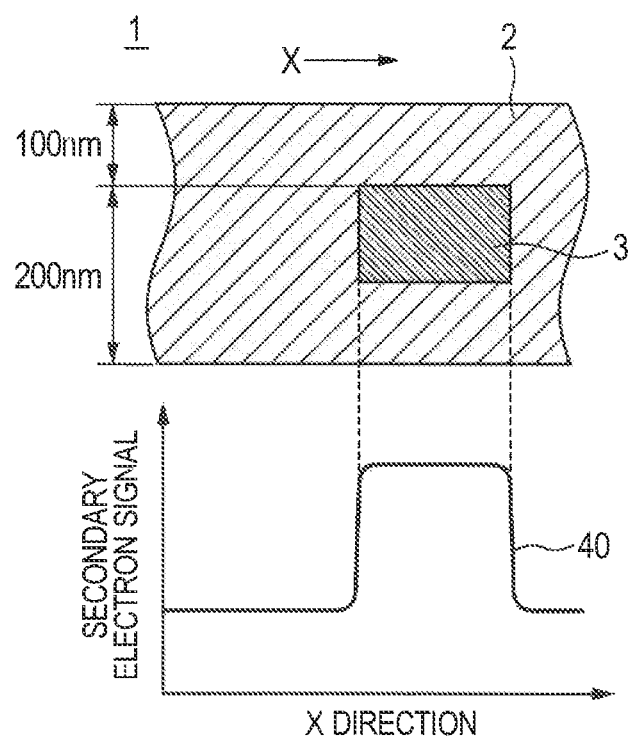
FIG. 4A is a diagram showing one example of a secondary electron signal profile to be used in the image capturing method of the embodiment 1.
Figure 4B:
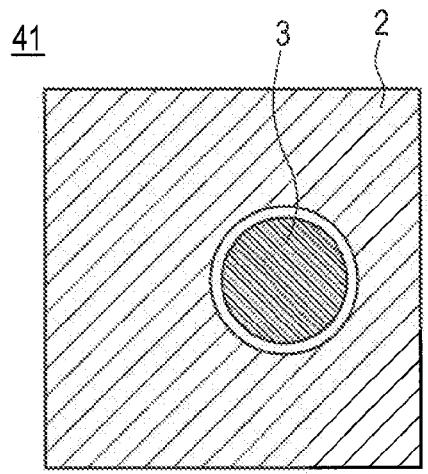
FIG. 4B is a diagram showing one example of an image acquired by the image capturing method of the embodiment 1.

Incidentally, although the incident energy of 300 eV of the electron beam was used in the present embodiment, the energy in a range from 1 eV to 30000 eV can be set in consideration of restrictions on the device pertaining to the present invention and an image capturing object. However, by controlling pulsed electron irradiation and the detection timing and the detection time of the secondary electron, a bright contrast can be obtained in a region where the polysilicon 3 is embedded as shown by a secondary electron signal profile 40 in FIG. 4A and further an SEM image 41 in FIG. 4B. Since the observed polysilicon 3 is cylindrical (for example, a plug in a semiconductor element or the like) in the present embodiment, its upper face is circular as shown in FIG. 4B, and its section is rectangular as shown in FIG. 4A.

Since the secondary electron signal can be detected by selecting the time-domain that the necessary sample information is included by using the present embodiment as mentioned above, sample analysis with high image quality becomes possible.

Embodiment 2

Figure 5:
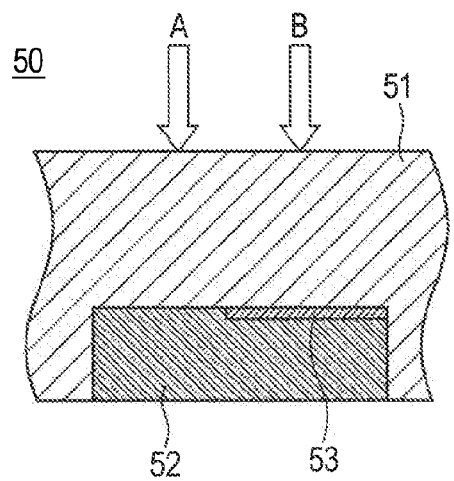
FIG. 5 is a sectional diagram showing one example of a sample of an embodiment 2.

In the present embodiment, an image capturing method in case of irradiating the same place with a plurality of pulsed electrons will be described. A device of a configuration which is the same as that in FIG. 2 was used. A sample used in the present embodiment is shown in FIG. 5. The sample has a laminate structure of an oxide film 51 and a polysilicon film 52. An interface between the oxide film and the polysilicon film is divided into a region A having a normal interface and a region B having a rough interface 53. A relation between a secondary electron signal and a number of pulses was examined using the aforementioned sample. A result thereof is shown in FIG. 6B.

Figure 6A:
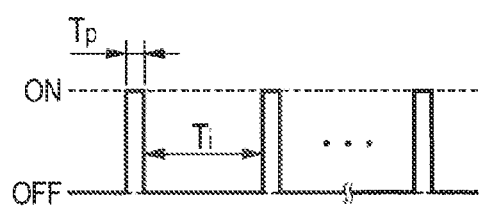
FIG. 6A is a diagram showing one example of a time chart for irradiation of pulsed electrons.
Figure 6B:
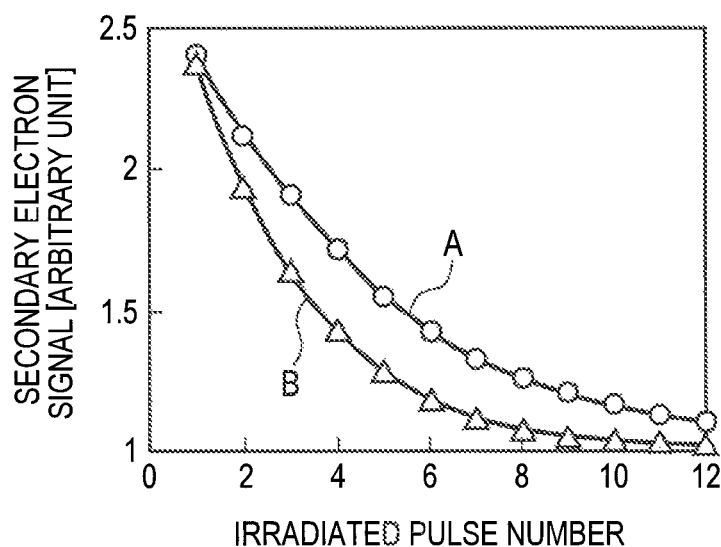
FIG. 6B is an explanatory diagram showing a signal change of a secondary electron under irradiation with a plurality of pulsed electrons.

FIG. 6A is a time chart for pulsed electron irradiation. The intermittent condition of the electron beam was set such that the pulse width $T_p$ is 0.05 ms, the inter-pulse interval $T_1$ is 0.5 ms, and a number of irradiated pulses N is 12 shots. FIG. 6B is a diagram showing a relation between the secondary electron signal and the number of irradiated pulses in the region A and the region B. In the drawing, the intensities of the secondary electron signal obtained corresponding to the first irradiated pulse to the twelfth irradiated pulse are indicated on an arbitrary scale. This secondary electron signal was set to the mean value of the secondary electron signals included in the pulses. It is attenuated with increasing the number of pulses both in the region A and the region B and is made steady state. A difference in intensity of the secondary electron signal between the region A and the region B is maximized with the number of pulses N=4. As described above, the difference between the region A and the region B reflecting the interface state is exhibited in a specific pulse. That is, in case of irradiating the same placed with the plurality of pulsed electrons, it is necessary to detect the secondary electron signal by selecting the pulse.

Figure 7:
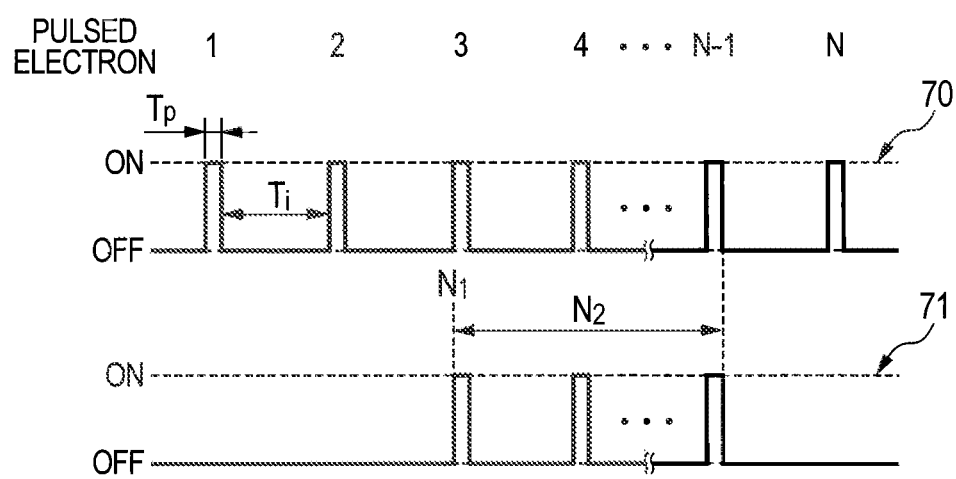
FIG. 7 is an explanatory diagram showing one example of time charts for pulsed electron irradiation and detection of the embodiment 2.

The image capturing method under pulsed electron beam irradiation in the present embodiment is shown in FIG. 7. A time chart 70 indicates the intermittent condition of the electron beam. The intermittent condition in the present embodiment is the pulse width, the inter-pulse interval and a pulsed electron irradiation frequency. The pulsed electron is controlled under the intermittent condition of the pulse width $T_p$, the inter-pulse interval $T_1$ and the number of pulses N. The same place is irradiated with the pulsed electrons having the aforementioned intermittent condition. In the present embodiment, the same place is defined by the same pixel, and here it would be sufficient if a plurality of pulses is irradiated into the same pixel.

A detection start pulse $N_1$ and a number of detected pulses $N_2$ are controlled by the detector control unit 23 as shown in a time chart 71 in synchronization with the pulsed electrons shown in time chart 70. In the present embodiment, the pulse width $T_p$ was 0.05 ms, the inter-pulse interval $T_1$=0.5 ms, the number of irradiated pulses N=12 shots, a detection start pulse $N_1$=3, and a number of detected pulses $N_2$=6. Although the present embodiment is of a configuration that all secondary electrons during irradiation with a designated pulse are acquired, a detection timing and a detection time in the pulse may be designated in addition to designation of the pulse to be detected as shown in the embodiment 1. Since only the pulse having the sample information which reflects the interface state can be detected by the image capturing method concerned, analysis of the interface becomes possible with a high contrast. Although the present embodiment is of a configuration that the pulse to be detected is selected by the detector control unit 23, all the secondary electron signals included in the plurality of pulses with which the same place is irradiated may be acquired and the secondary electron signal included in the aforementioned detected pulse may be cut out by data processing by the detection signal processing unit 24. Since the secondary electron signal can be detected by selecting the pulse in which the necessary sample information is included by using the present embodiment as mentioned above, sample analysis with high image quality becomes possible.

Embodiment 3

Figure 8:
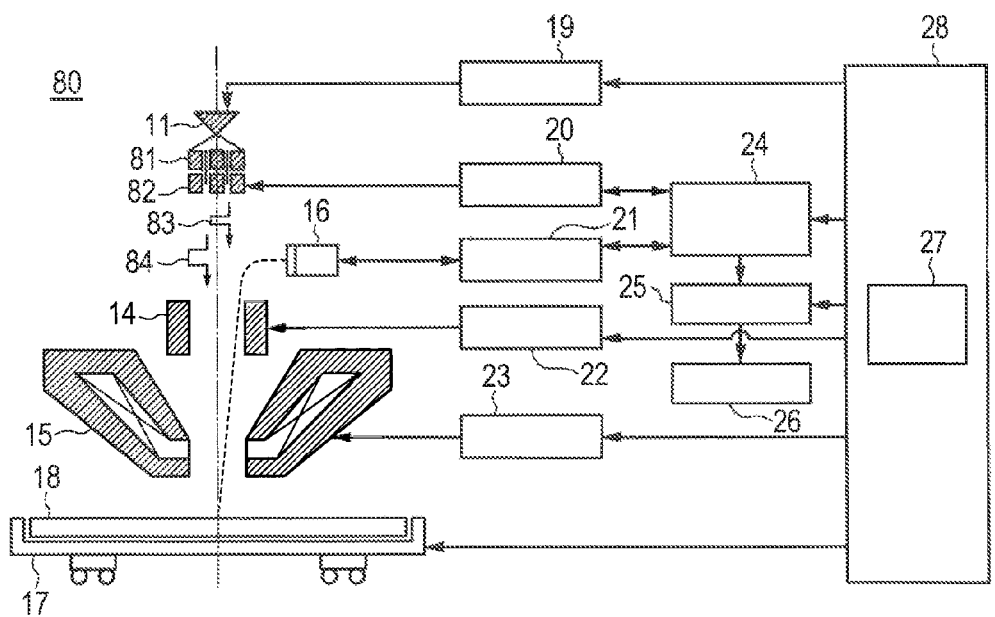
FIG. 8 is a configuration diagram showing one example of an electron microscope of the present invention.

In this embodiment, an image capturing method in case of irradiating the same place under a plurality of pulsed electron conditions will be described. A configuration example of a scanning electron microscope in the present embodiment is shown in FIG. 8. A scanning electron microscope 80 is different from the scanning electron microscope 10 shown in FIG. 2 in pulse generation system. In the present embodiment, an electron beam is once split into two beams by a beam splitter 81 and a pulsed electron 83 having a first intermittent condition and a pulsed electron 84 having a second intermittent condition are generated by a multi-pulse generator 82 allowing setting of the intermittent condition for each electron beam. The pulsed electrons having the aforementioned first and second intermittent conditions are focused onto the same place by an objective lens. In the present embodiment, the same place was defined by overlap of irradiation regions. Here, the irradiation regions of the pulsed electrons having the aforementioned first and second intermittent conditions need only be overlapped just partially and there is no need for the pulsed electrons having the aforementioned first and second intermittent conditions to have the same irradiation region. Although the present embodiment is of a configuration that the electron beam is split to control the plurality of intermittent conditions, the pulsed electrons having the aforementioned first and second intermittent conditions can be controlled by generating a control signal that a plurality of intermittent conditions are combined by the pulse control unit 20 even in the configuration shown in FIG. 2.

Figure 9:
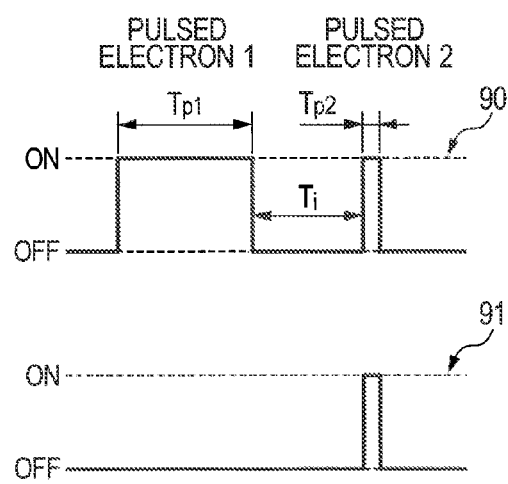
FIG. 9 is an explanatory diagram showing one example of time charts for pulsed electron irradiation and detection of an embodiment 3.

The image capturing method under pulsed electron beam irradiation in the present embodiment is shown in FIG. 9. A time chart 90 indicates the first and second intermittent conditions by one chart. The intermittent condition in the present embodiment is the pulse width and the inter-pulse interval. The pulsed electron is controlled with a pulse width $T_{p1}$ which is the first intermittent condition and a pulse width $T_{p2}$ which is the second intermittent condition, and a first pulsed electron and a second pulsed electron are irradiated synchronously in an interval $T_i$. A secondary electron signal is detected in synchronization with the second pulse as shown in a time chart 91.

Figure 10:
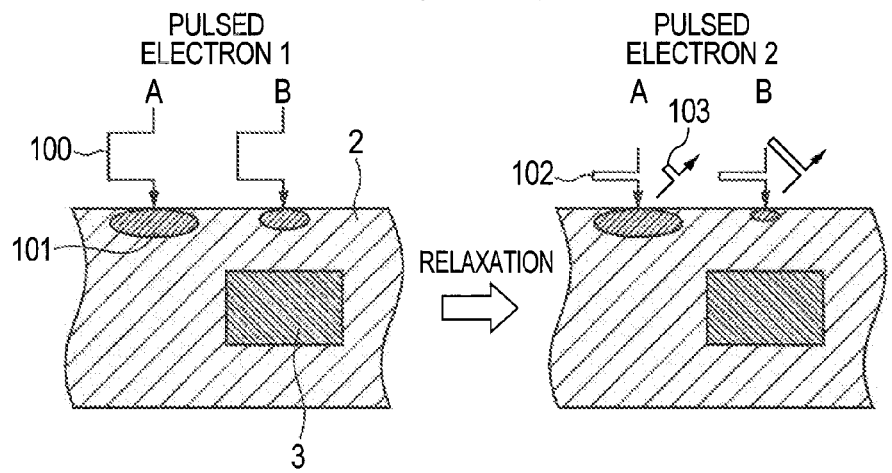
FIG. 10 is an explanatory diagram showing a relation between pulsed electron irradiation and secondary electron emission of the embodiment 3.

In the present embodiment, the image capturing method of pulsed electrons will be described by giving a case that an embedded structure shown in FIG. 10 is observed as an example. The sample is configured by the region A of the silicon oxide film 2 and the region B that the polysilicon 3 is embedded in the silicon oxide film similarly to FIG. 1A. Since a sample electrical charge 101 which has been generated with a first pulsed electron 100 is accumulated in accordance with an embedded shape of the sample, a difference is generated between the region A and the region B. Further, since the aforementioned sample electrical charge 101 is different in time constant for electrical charge relaxation between the region A and the region B, the difference is increased in the interval Ti. When the aforementioned sample electrical charge is irradiated with a second pulsed electron 102, a difference is generated in signal pulse 103 of the secondary electron in accordance with a retention amount of the electrical charge. In order to obtain a difference in the aforementioned sample electrical charge 101, it is desirable that the first pulsed electron 100 be under a condition that several thousand electrons are irradiated. Incidentally, the number of electrons can be obtained by multiplying a current amount (I) obtained from the electron beam to be irradiated by a pulse width (t) of a pulse to be applied and dividing a value thereof by an elementary charge amount (q).

It is desirable that the second pulsed electron 102 be under a condition that several tens electrons of such a number that the sample electrical charge 101 formed with the first pulsed electron is not broken are irradiated. In addition, it is desirable that the interval $T_i$ be set in a range from 0.001 ms to 1000 ms of a level of the time constant for dielectric relaxation. Here, the first pulsed electron 100 is for pulse irradiation in order to form the aforementioned sample electrical charge 101 and does not contribute to an image. The image reflecting the embedded structure can be obtained by detecting only the second pulsed electron 102 for detecting the difference in the sample electrical charge 101. Although the present embodiment is of a configuration that it is detected in synchronization with the second pulse condition by the detector control unit 23, all the secondary electron signals included in the conditions of the plurality of pulsed electrons with which the same place is irradiated may be acquired and the secondary electron signal included in the aforementioned second pulse condition may be cut out in data processing by the detection signal processing unit 24. Since the image can be formed by cutting apart the pulse for processing the sample electrical charge and the pulse for detecting the sample electrical charge by using the present embodiment as mentioned above, information selectivity is increased and sample analysis with high image quality becomes possible.

Embodiment 4

In the present embodiment, an image capturing method in case of irradiating the same place under a plurality of pulsed electron conditions will be described. The device of the configuration which is same as that in FIG. 2 was used.

Figure 11:
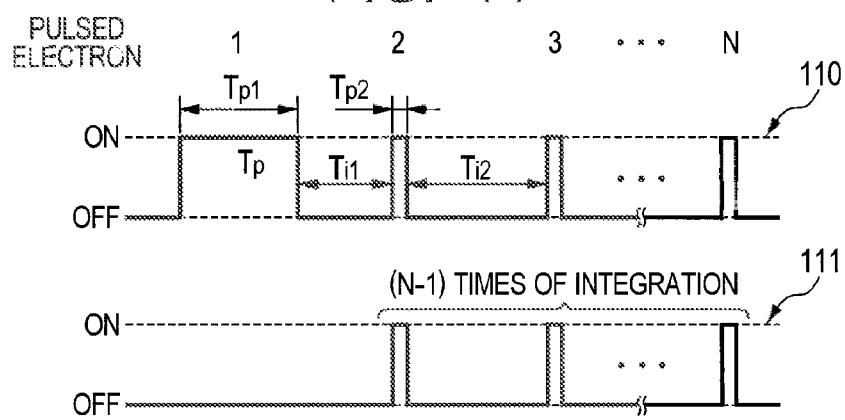
FIG. 11 is an explanatory diagram showing one example of time charts for pulsed electron irradiation and detection of a fourth embodiment.

The image capturing method under pulsed electron beam irradiation in the present embodiment is shown in FIG. 11. A time chart 110 is the one that first and second intermittent conditions are indicated by one chart. The intermittent condition in the present embodiment is the pulse width, the inter-pulse interval and the pulsed electron irradiation frequency. The pulsed electron is controlled with the pulse width $T_{p1}$ which is the first intermittent condition and the pulse width $T_{p2}$ which is the second intermittent condition, and a first pulsed electron and a second pulsed electron are irradiated synchronously in an interval $T_{i1}$. The second pulsed electron is irradiated N times in an interval $T_{i2}$. At that time, it is adjusted in the interval $T_{i2}$ such that electrical charging does not progress by irradiating the second pulsed electron N times. At that time, it is desirable that total number of second pulsed electrons which are irradiated N times be equal to the number of electrical charges relaxed in the interval $T_{i2}$ or a difference be not more than 100. The secondary electron signal is detected in synchronization with the second pulse as shown in a time chart 111. The detected N−1-time secondary electron signals are integrated by the detection signal processing unit 23 and become a signal of one pixel. Although the present embodiment is of a configuration that it is detected in synchronization with the second pulse condition by the detector control unit 23, all the secondary electron signals included in the conditions of the plurality of pulsed electrons with which the same place is irradiated may be acquired and the secondary electron signals included in the aforementioned second pulse condition may be extracted and integrated in data processing by the detection signal processing unit 24. Since the pulses configuring the image can be integrated by using the present embodiment as mentioned above, sample analysis with high image quality becomes possible.

Embodiment 5

In the present embodiment, an image capturing method of pulsed electron beams with which the same place is irradiated under a plurality of intermittent conditions to visualize images which are different in sample information at a time will be described. The device of the configuration which is the same as that in FIG. 2 was used. The plurality of pulsed electron conditions were controlled by the pulse control unit 20. In the present embodiment, a plurality of memories are installed on the image forming unit 25 and a signal from the detection signal processing unit 24 can be written by selecting a memory. By the present device, a plurality of images can be processed at a time.

Figure 12:
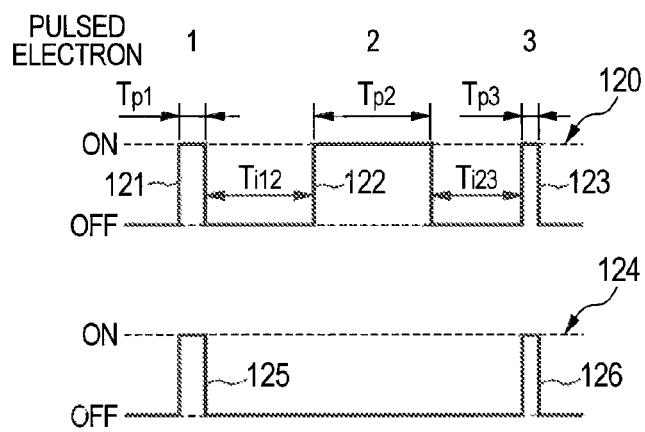
FIG. 12 is an explanatory diagram showing one example of time charts for pulsed electron application and detection of an embodiment 5.

The image capturing method under pulsed electron beam irradiation in the present embodiment is shown in FIG. 12. A timing chart 120 is the one that first, second and third intermittent conditions are indicated by one chart. The intermittent condition in the present embodiment is the pulse width, the inter-pulse interval and the pulsed electron irradiation frequency. The pulsed electron is controlled with the pulse width $T_{p1}$ of a first pulsed electron 121, the pulse width $T_{p2}$ of a second pulsed electron 122 and a pulse width $T_{p3}$ of a third pulsed electron 123, and the aforementioned first pulsed electron and the aforementioned second pulsed electron, and the aforementioned second pulsed electron and the aforementioned third pulsed electron are irradiated synchronously in an interval $T_{i12}$ and an interval $T_{i23}$. As for secondary electron signals, as shown in a time chart 124, a first secondary electron signal 125 which is detected in synchronization with the first pulse and a second secondary electron signal 126 which is detected in synchronization with the third pulse are respectively stored in separate memories. Finally, two kinds of images by the first secondary electron signal 125 and the second secondary electron signal 126 are formed.

Figure 13:
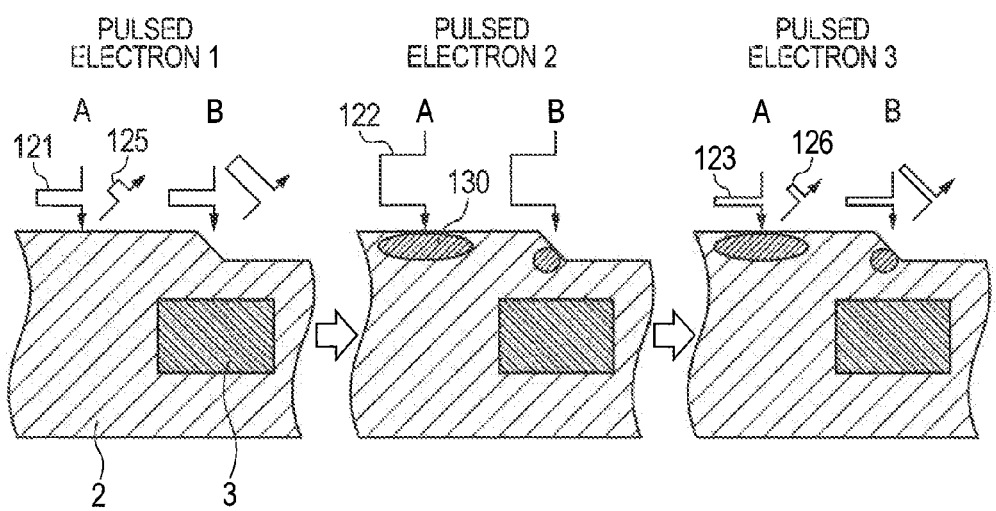
FIG. 13 is an explanatory diagram showing a relation between pulsed electron irradiation and secondary electron emission of the embodiment 5.

In the present embodiment, the image capturing method of the pulsed electron will be described by giving a case that a surface shape and an embedded structure shown in FIG. 13 are to be simultaneously observed as an example. A sample used in the present embodiment is shown in FIG. 13. The aforementioned sample is configured by the region A of the silicon oxide film 2 and the region B that the polysilicon 3 is embedded in the silicon oxide film. Further, the region B has a stepped shaped on its surface. A first pulsed electron is set to an irradiation condition that electrical charging under electron beam irradiation almost never influences a secondary electron signal. At that time, the secondary electron signal depends on the surface shape. Since an emission amount of the secondary electrons is made different in accordance with an angular variation and an edge of the sample, a difference is generated in the first secondary electron signal 125 between the region A and the region B. Then, an electrical charge 130 is formed with the second pulsed electron similarly to the aforementioned embodiment 3 and the aforementioned electrical charge is detected with the third pulsed electron. The second secondary electron signal 126 which is obtained at that time reflects the embedded structure of the sample. An image having the information on the surface shape and an image having the information on the embedded structure can be simultaneously acquired with the first secondary electron signal 125 and the secondary electron signal 126.

Since the images can be formed by classifying the pulsed electrons having the plurality of intermittent conditions to different pieces of sample information by using the present embodiment as mentioned above, it becomes possible to simultaneously visualize and analyze the plurality of pieces of sample information.

Embodiment 6

In the present embodiment, an image capturing method of pulsed electron beams with which the same place is irradiated under a plurality of intermittent conditions to visualize a time change of sample information will be described. The device of the configuration which is the same as that in FIG. 2 was used. A plurality of pulsed electron conditions is controlled by the pulse control unit 20. In the present embodiment, a plurality of memories are installed on the image forming unit 25 and a signal from the detection signal processing unit 24 can be written by selecting a memory. A plurality of images can be processed at a time by the present device.

Figure 14:
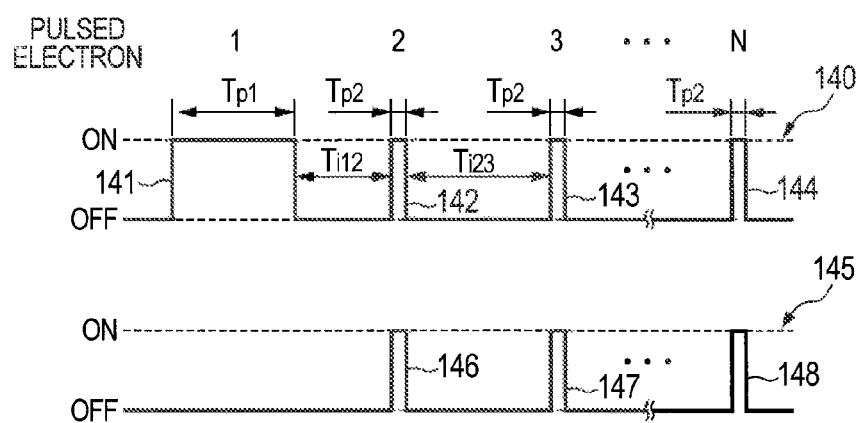
FIG. 14 is an explanatory diagram showing one example of time charts for pulsed electron irradiation and detection of an embodiment 6.

The image capturing method under pulsed electron beam irradiation in the present embodiment is shown in FIG. 14. A time chart 140 is the one that first and second intermittent conditions are indicated by one chart. The intermittent condition in the present embodiment is the pulse width, the inter-pulse interval and the pulsed electron irradiation frequency. A first pulsed electron 141 is irradiated with the pulse with $T_{p1}$, and second pulse electron 142 and succeeding ones are irradiated N times with the pulse width $T_{p2}$. Intervals between the aforementioned pulsed electrons can be set to the interval $T_{i12}$, the interval $T_{i23}$ . . . between respective pulses.

Figure 15:
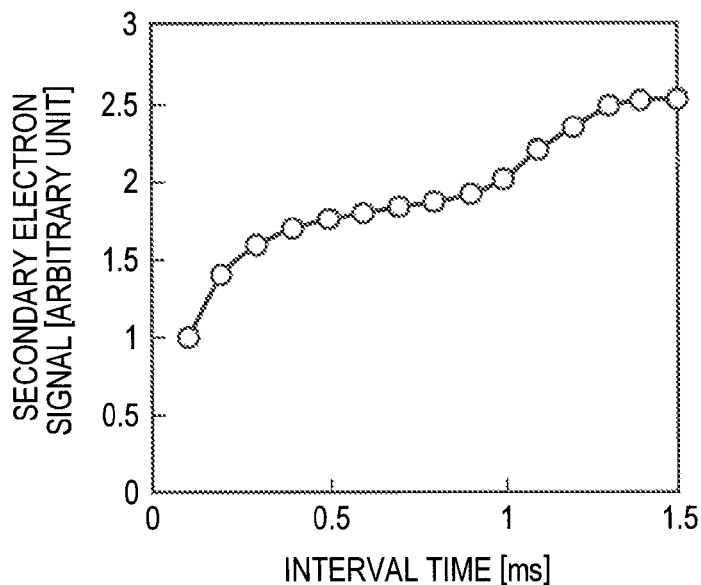
FIG. 15 is an explanatory diagram showing an inter-pulse interval and a signal change of a secondary electron.

In the present embodiment, the image capturing method of pulsed electrons will be described by giving a case that the embedded structure shown in FIG. 1A is observed as an example. An electrical charge is formed on the surface with the first pulsed electron. At that time, if the second pulse is irradiated while changing the interval time from the first pulsed electron, a signal change of the secondary electron according to the interval $T_{i12}$ between the first pulsed electron and the second pulsed electron can be obtained. Since a relaxation amount of the electrical charge obtained with the first pulsed electron is made different in accordance with the length of the interval, the secondary electron signal obtained with the second pulsed electron is changed. The relaxation amount of the aforementioned electrical charge has a plurality of time constants as shown in FIG. 15 by being induced by the embedded structure of the sample. The internal structure can be analyzed by analyzing the aforementioned time constants. An internal three-dimensional structure can be restored by acquiring dependency of the interval time pixel by pixel.

In the present embodiment, the second to N-th pulsed electrons for electrical charge detection which are acquired in different intervals are stored in the respective memories to acquire a time-resolved image of the electrical charge. The three-dimensional structure can be constructed by analyzing the time-resolved image concerned. Since the time-resolved image of the electrical charge can be acquired by using the present embodiment as mentioned above, analysis of the three-dimensional structure becomes possible.

Embodiment 7

Figure 16:
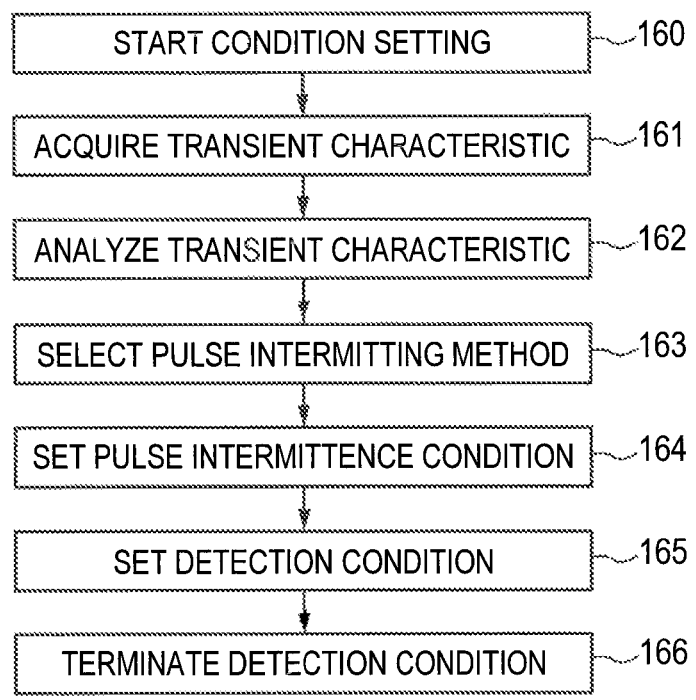
FIG. 16 is a diagram showing one example of a flowchart for setting an image capturing condition of the present invention.

In the present embodiment, an image capturing condition setting method will be described. The configuration of the device is the same as the configuration in FIG. 2. A flow chart showing the image capturing condition setting method in the present embodiment is shown in FIG. 16.

In a condition setting mode (step 160), intermittent condition and detection condition of a pulsed electron beam are determined from transient characteristics of a secondary electron signal. There are a method of estimating the transient characteristics of the secondary electron signal in advance from data, base which has acquired the transient characteristics and a method of acquiring the transient characteristics at a random position on a sample. In the present embodiment, description will be made by giving the method of acquiring the transient characteristics at the random position on the sample as an example. The random position on the sample is automatically or manually selected and a change in the secondary electron signal during pulse irradiation in FIG. 1B and the dependency of the secondary electron signal on the inter-pulse interval time in FIG. 14 are acquired (step 161). The irradiated electron amount when the secondary electron signal is in a steady state and the time constant for signal relaxation can be analyzed from FIG. 1B and FIG. 15 (step 162). The steady state irradiated electron amount obtained from the random position is compared with the relaxation time constant to determine an intermittent condition for pulse irradiation (stop 163). For example, when a difference in steady state irradiated electron amount is larger than a difference in relaxation time constant, it is desirable to set to the single pulse in the aforementioned embodiment 1, and when the difference in relaxation time constant is larger, it is desirable to irradiate the plurality of pulsed electrons indicated in the aforementioned embodiment 2 or 3. Description will be made by giving the case of irradiation with the plurality of pulsed electrons in the aforementioned embodiment 2 as an example. A favorable pule width is set from the difference in the steady state irradiated electron amount, and favorable inter-pulse interval and irradiation frequency are set from a difference in relaxation time constant (step 164). The detection condition is selected in consideration of a time-domain that necessary information is obtained and SN of the image (step 165). In addition, it is also possible to set the detection condition, for example, by acquiring the relation between the pulse number and the secondary electron signal as shown in FIG. 6 of the aforementioned embodiment 2. Then, condition setting is terminated, thereby proceeding to observation (step 166).

Figure 17:
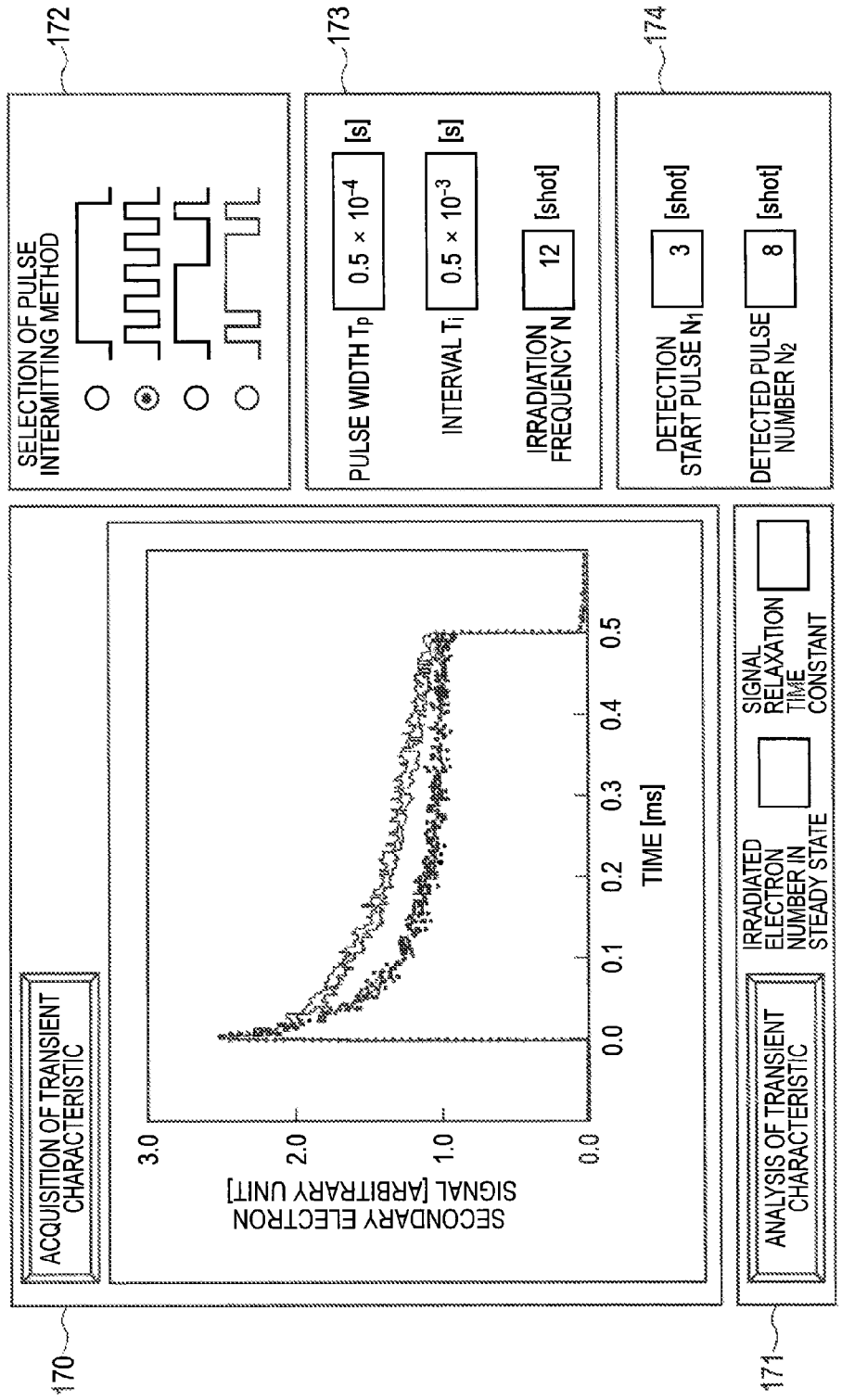
FIG. 17 is a diagram showing one example of GUI for setting the image capturing condition of the present invention.

GUI for setting the image capturing condition in the present embodiment is shown in FIG. 17. When selecting setting of the image capturing condition, the GUI in FIG. 17 is displayed on a monitor of the operation interface 27. A window 170 is a window for acquiring the transient characteristics of the secondary electron signal, and data on transient characteristics such as the secondary electron signal change during pulse irradiation, the dependency of the secondary electron signal on the inter-pulse interval time and so forth is displayed. On a window 171, characteristic values obtained from an analyzed result of the transient characteristics of the aforementioned secondary electron signal are displayed. A pulse intermitting method can be selected from the aforementioned transient characteristic data and the aforementioned characteristic values by a window 172. Further, the intermittent condition and the detection condition can be set by a window 173 and a window 174. Since setting of the image capturing condition can be readily performed by using the present embodiment as mentioned above, the image can be obtained in a short time.

Embodiment 8

Figure 18:
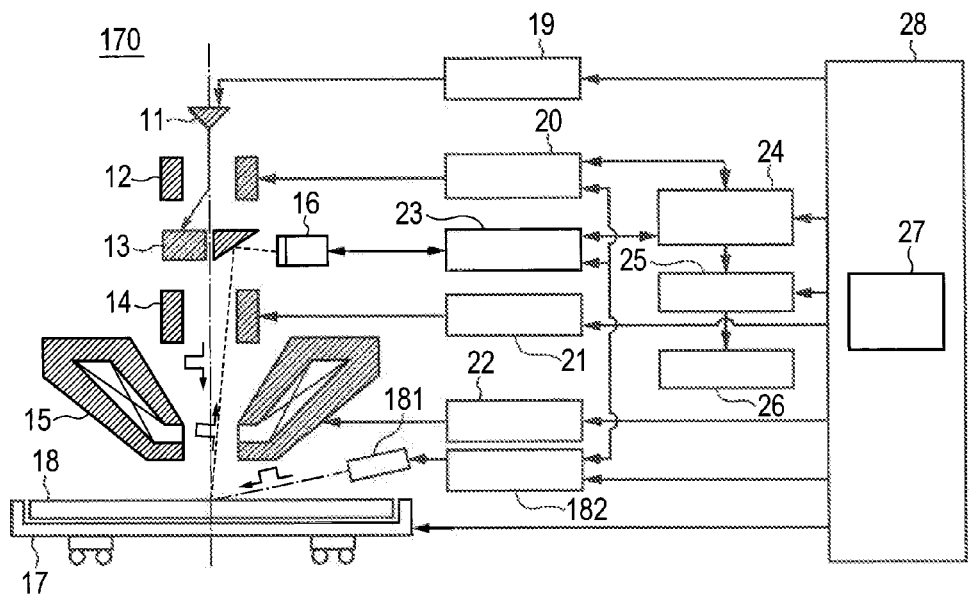
FIG. 18 is a configuration diagram showing one example of an electron microscope of an embodiment 8.

In the present embodiment, an image capturing method of pulsed electron beam that a sample shape is visualized with an intermittent line and an intermittent electron beam irradiated onto the same place will be described. A configuration of the device is shown in FIG. 18. An intermittent energy line source 181 and an energy line control unit 182 are added to the device configuration in FIG. 2. In the present embodiment, a pulsed laser was used as the intermittent energy source. The present invention can use energy lines such as X rays, light, infrared rays and so forth and is not limited to the present embodiment.

Figure 19:
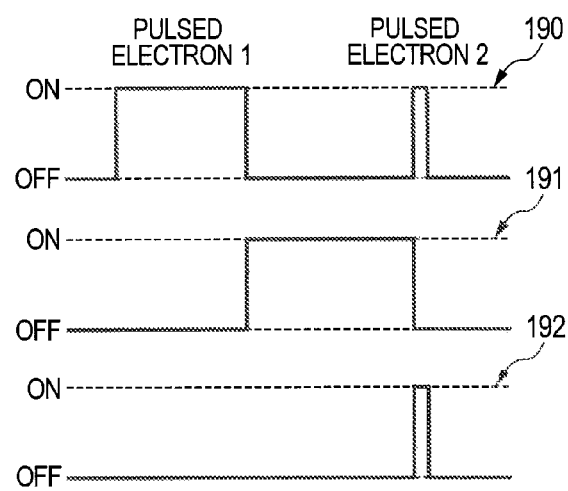
FIG. 19 is an explanatory diagram showing one example of a time chart for pulsed electron and energy line irradiation and detection of the embodiment 8.

The image capturing method under pulsed electron beam irradiation in the present embodiment is shown in FIG. 19. A time chart 190 indicates a first intermittent condition and a second intermittent condition in one chart. The intermittent condition in the present embodiment is the pulse width, the inter-pulse interval and the pulsed electron irradiation frequency. In the present embodiment, the same place is irradiated with a first pulsed electron and a second pulsed electron which are different in intermittent condition. A timing chart 191 indicates an irradiation timing of the pulsed laser. The aforementioned pulsed laser is irradiated to between the aforementioned first pulsed electron and second pulsed electron. A time chart 192 indicates a detection timing of a secondary electron, and in the present embodiment, it was supposed to synchronize with the aforementioned second pulsed electron. The relaxation characteristic of the electrical charge of the sample which has been processed with the aforementioned first pulse changes in accordance with a response of dielectric polarization by the pulsed laser. Since the change in the aforementioned relaxation characteristic depends on the composition and the structure of the sample, the secondary electron signal by the second pulsed electron reflects the composition and the structure of the sample.

It becomes possible to select information which is not limited to the sample information which depends on the state induced by electron beam irradiation by using the present embodiment as mentioned above and the kinds of sample information which can be analyzed can be increased.

Embodiment 9

In the present embodiment, an analyzing method using pulsed electron beam that an intermittent electron beam is specified in a state that the orbit of a secondary electron emitted from a sample is controlled to detect the secondary electron will be described.

Figure 20:
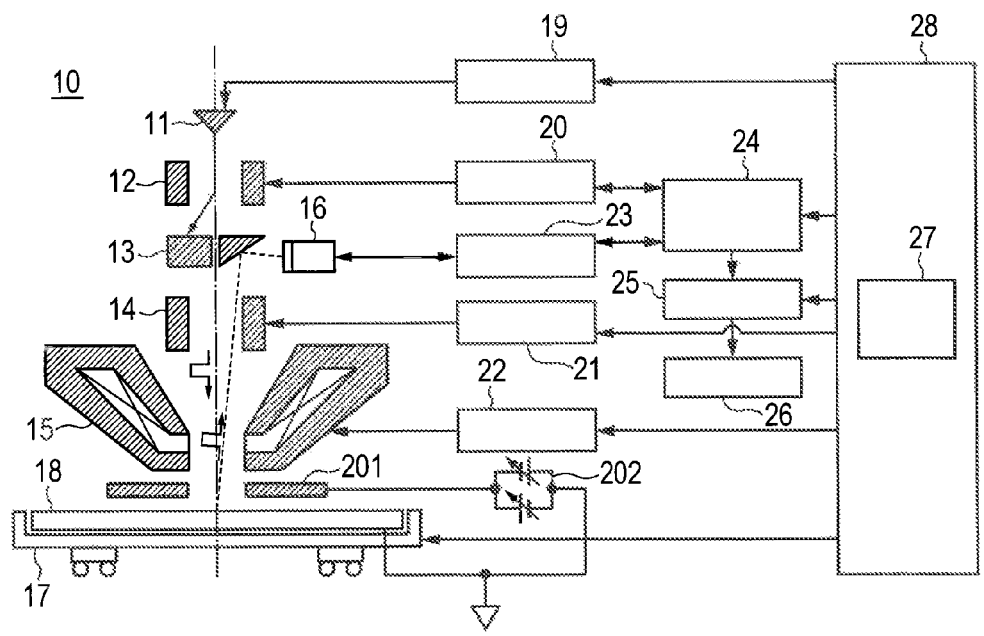
FIG. 20 is a configuration diagram showing one example of an electron microscope of an embodiment 9.
Figure 21A:
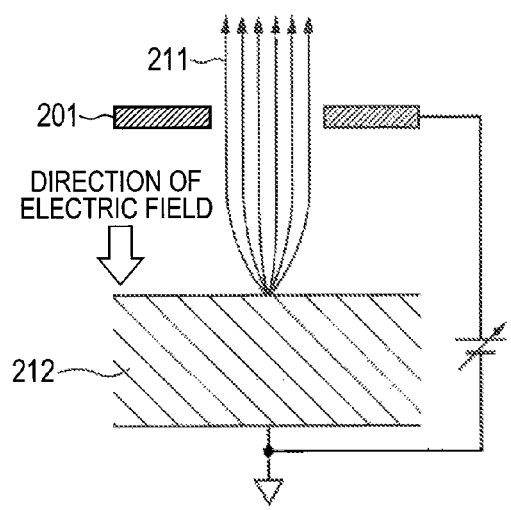
FIG. 21A is a diagram showing an electric field in the vicinity of an electron beam irradiation surface of a sample corresponding to a polarity of an electric field control electrode.

The configuration of the device is shown in FIG. 20. In addition to the device configuration in FIG. 2, an electrode 201 for controlling an electric field from a sample is installed above the sample. The aforementioned electrode is capable of controlling the electric field in the vicinity of an electron beam irradiation surface of the sample by a voltage application unit 202. FIG. 21 is a diagram indicating a relation between a direction of the electric field and the orbit of the secondary electron. In a case where a positive voltage has been applied to the electrode 201 for the sample as shown in FIG. 21A, the secondary electron is accelerated with the electric field between the sample and the electrode and secondary electrons of all energies are emitted from the sample. In a case where emission of the secondary electrons is more than that of primary electrons, the surface of the sample is positively charged.

Figure 21B:
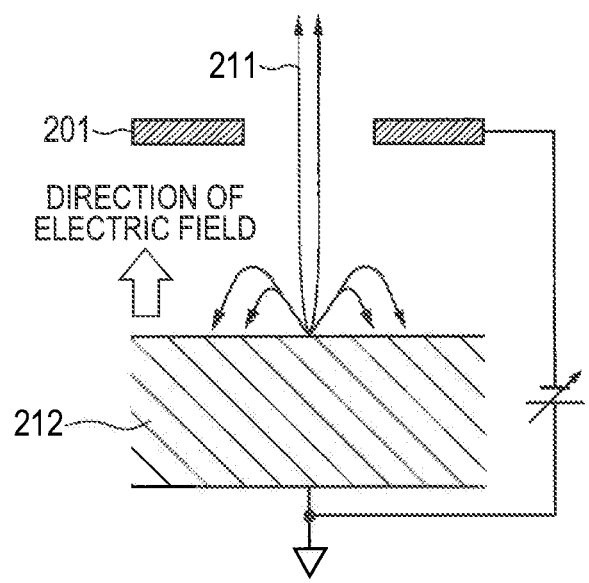
FIG. 21B is a diagram showing the electric field in the vicinity of the electron beam irradiation surface of the sample corresponding to the polarity of the electric field control electrode.

On the other hand, in a case where a negative voltage has been applied to the electrode 201 for the sample as shown in FIG. 21B, the secondary electrodes are attenuated with the electric field between the sample and the electrode and secondary electrons of some energies are returned to the sample. The sample is negatively charged in accordance with the amount of the secondary electrons returned to the sample.

Figure 22:
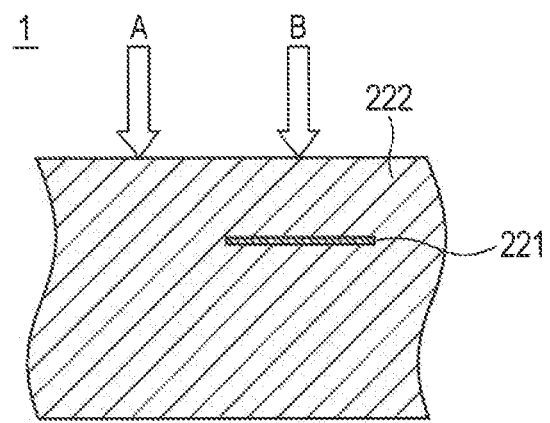
FIG. 22 is a sectional diagram showing one example of a sample of the embodiment 9.
Figure 23A:
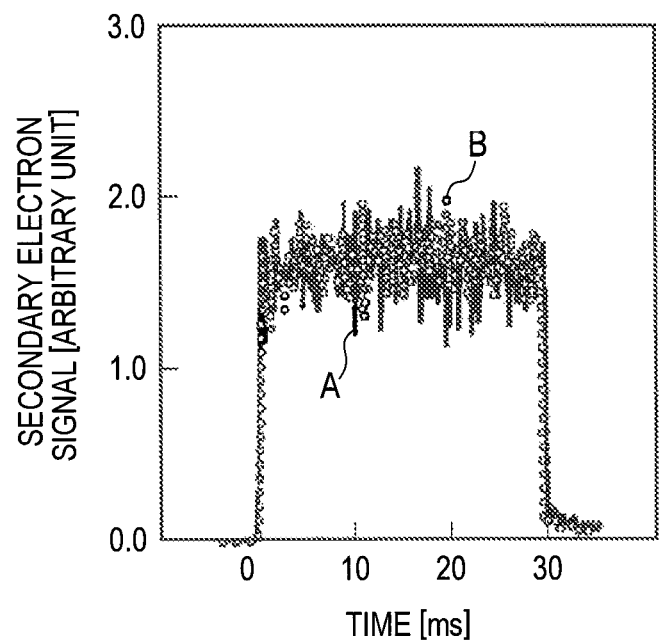
FIG. 23A is a diagram showing an electron emission signal under pulsed electron irradiation in a case where a positive voltage has been applied to an electric field control electrode.

As shown in FIG. 21, the polarity of the sample electrical charge can be switched depending on the direction of the electric field. FIG. 22 is a sectional diagram of the sample having an embedded interface which has been used in the present embodiment. An embedded interface 221 is present in silicon carbide 222. The embedded interface 221 is a stacking defect contained in a silicon carbide crystal. FIG. 22 is an electron emission signal (FIG. 23A) under pulsed electron irradiation in a case where the positive voltage has been applied to the aforementioned electrode 201 and a secondary electron emission signal (FIG. 23B) under pulsed electron irradiation in a case where the negative voltage has been applied to the aforementioned electrode 201. With the positive voltage, there is no difference in signal during pulse irradiation between the region A with no embedded interface and the region B that the embedded interface is present, and a difference in secondary electron emission signal cannot be obtained between the region A and the region B regardless of adjustment of the detection timing.

Figure 23B:
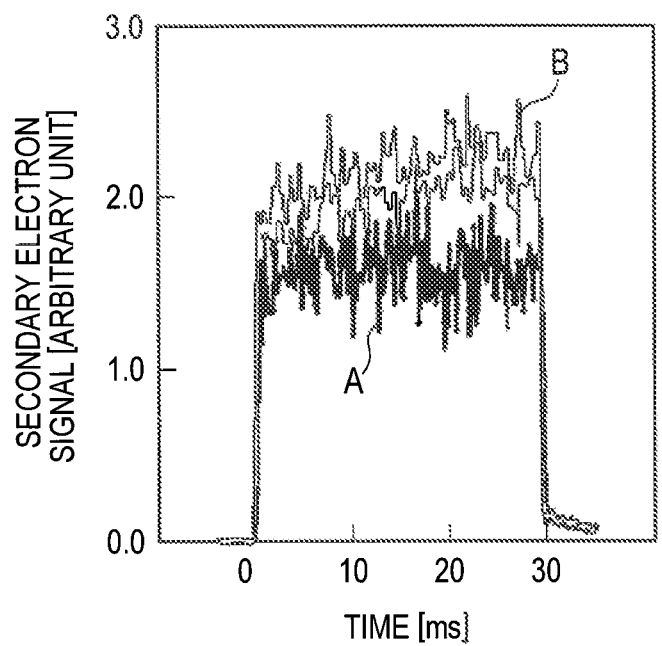
FIG. 23B is a diagram showing the electron emission signal under pulsed electron irradiation in a case where a negative voltage has been applied to the electric field control electrode.

On the other hand, it can be seen that the secondary emission electron signal transitionally changes in the region B that the embedded interface is present with the negative voltage as shown in FIG. 23B. A stacking defect which is the embedded interface in the aforementioned region B has the property to readily capture electrons. In the region A, the secondary electrons which have been returned with the electric field flow out via the sample. In the region B, it captures the returned secondary electrons and negatively charges them. The secondary emission electron signal transitionally changes in accordance with progress of negative charging. The difference in secondary electron emission signal between the regions A and B immediately after irradiated with the pulsed electron is small and the difference in secondary electron emission signal reaches a maximum in 10 to 30 ms. Therefore, when using the time charts for pulsed electron irradiation and detection in FIG. 3, it is desirable to detect the electron signal used for imaging in the range from 10 to 30 nm in the present embodiment. Since the transient characteristic caused by the electrical charge can be controlled in accordance with the sample by using the present embodiment as mentioned above, the selectivity of information is increased and sample analysis with high image quality becomes possible.

REFERENCE SIGNS LIST

1: sample sectional diagram
2: silicon oxide film
3: polysilicon
10: scanning electron microscope
11: electron gun
12: pulse generator
13: aperture
14: deflector
15: objective lens
16: detector
17: sample holder
18: sample
19: electron gun control unit
20: pulse control unit
21: deflection control unit
22: objective lens coil control unit
23: detector control unit
24: detection signal processing unit
25: image forming unit
26: image display unit
27: operation interface
28: SEM control unit
30: image
31: pixel
32, 33: time chart
34: signal waveform
40: profile
41: SEM image
50: sample
51: oxide film
52: polysilicon
53: interface
70, 71: time chart
80: scanning electron microscope
81: beam splitter
82: multi-pulse generator
83, 84: pulsed electron
90, 91: time chart
100: pulsed electron
101: sample electrical charge
102: pulsed electron
103: signal pulse
110, 111: time chart
120: time chart
121, 122, 123: pulsed electron
124: time chart
125, 126: secondary electron signal
130: sample electrical charge
140: time chart
141, 142, 143, 144: pulsed electron
145: time chart
146, 147, 148: pulsed electron
170, 171, 172, 173, 174: window
181: energy line source
182: energy line source control unit
190, 191, 192: time chat

The invention claimed is:

1. In an image capturing method using electron beam that a sample is irradiated with an electron beam and an electron emitted from the sample is detected to image a shape that the sample has,
   the image capturing method using electron beam, including:
      the electron beam irradiation step of irradiating a region which is planned to be observed of the sample with the electron beam for a predetermined time;
      the emitted electron detection step of detecting the electron emitted from the sample in a detection time which has been set shorter than the predetermined irradiation time within the predetermined irradiation time in the electron beam irradiation step, and
      the imaging step of imaging the shape of the sample on the basis of a detection signal of the emitted electron.

2. The image capturing method using electron beam according to claim 1, wherein
   irradiation for the predetermined time is repeated a plurality of times in the electron beam irradiation step, and
   the electron which has been emitted from the sample during at least one time electron beam irradiation in the irradiation which has been repeated the plurality of times is detected.

3. The image capturing method using electron beam according to claim 1,
   wherein in the electron beam irradiation step, the predetermined time is constituted of a first irradiation time and a second irradiation time which is different from the first irradiation time, the region planned to be observed of the sample is irradiated with the electron beam by using at least the first and second irradiation times and leaving an interval time between the first irradiation time and the second irradiation time, and an electron which has been emitted from the sample during electron beam irradiation having at least one irradiation time of the two irradiation times us detected.

4. The image capturing method using electron beam according to claim 3,
wherein the sample is electrically charged within the first irradiation time, and
electrical charging of the sample is detected within the second irradiation time.

5. The image capturing method using electron beam according to claim 4,
wherein the number of times of irradiation performed within the second irradiation time is a plurality of times, and
including:
the step of detecting the electron emitted from the sample in synchronization with the second irradiation time, and
the step of integrating and imaging the plural-time emitted electrons which have been detected in synchronization with the second irradiation time.

6. The image capturing method using electron beam according to claim 4,
wherein the number of electrons to be irradiated in the first irradiation time is in a range from 100 to 10000,
the number of electrons to be irradiated in the second irradiation time is in a range from 1 to 100, and
the interval time from the first irradiation time up to execution of the second irradiation time is 0.001 ms to 1000 ms.

7. The image capturing method using electron beam according to claim 5,
wherein the number of electrons to be irradiated in the first irradiation time is in a range from 100 to 10000,
the number of electrons to be irradiated in the second irradiation time is in a range from 1 to 100, and
the interval time from the first irradiation time up to execution of the second irradiation time is 0.001 ms to 1000 ms.

8. The image capturing method using electron beam according to claim 7, wherein an incident energy of the electron beam is 1 eV to 3000 eV.

9. The image capturing method using electron beam according to claim 8, wherein transient characteristics of the emitted electron are acquired, and an irradiation time of the electron beam and a detection condition for the electron emitted from the sample are set on the basis of the transient characteristics.

10. The image capturing method using electron beam according to claim 1,
wherein in the electron beam irradiation step, a plurality of kinds of irradiation times for which the region planned to be observed of the sample is irradiated with the electron beam are prepared,
in the emitted electron detection step, in the plurality of kinds of irradiation times, at least two kinds of irradiation times are selected, and an electron emitted from the sample is detected in synchronization with each of the selected two kinds of irradiation times, and
in the imaging step, at least two kinds of sample shapes are imaged on the basis of a detection signal of the emitted electron.

11. The image capturing method using electron beam according to claim 10,
wherein the plurality of kinds of irradiation times are configured by a first irradiation time that the irradiation time has been set so as to reflect a surface shape of the sample,
a second irradiation time that the irradiation time has been set so as to control electrical charging of the sample, and
a third irradiation time that the irradiation time has been set so as to detect electrical charging of the sample, and
the selected irradiation times are the first irradiation time and the second irradiation time.

12. The image capturing method using electron beam according to claim 1,
wherein in the electron beam irradiation step, a first irradiation time and a second irradiation time which is different from the first irradiation time are prepared for the region planned to be observed of the sample,
including the step of changing an interval time from expiration of the first irradiation time up to execution of the second irradiation time,
in the emitted electron detection step, the electron emitted from the sample is detected in synchronization with the second irradiation time for which is irradiated for each change in the interval time, and
in the imaging step, an image for each change in the interval time is formed from a detection signal of the emitted electron.

13. The image capturing method using electron beam according to claim 12, wherein transient characteristics of the emitted electron are acquired, and an irradiation time of the electron beam and a detection condition for the electron emitted from the sample are set on the basis of the transient characteristics.

14. The image capturing method using electron beam according to claim 1,
further having: the step of intermittently irradiating an energy line at a timing different from that of irradiation of the electron beam,
wherein in the emitted electron detection step, the electron emitted from the sample is detected in synchronization with a condition that the electron beam is irradiated for a predetermined time.

15. The image capturing method using electron beam according to claim 1,
further having: the step of controlling an electric field in the vicinity of an interface that the sample is irradiated with the electron beam,
wherein the emitted electron is detected on the basis of an irradiation condition of the electron beam in the electron beam irradiation step, thereby analyzing the characteristics of the sample by using the detection signal.

16. An electron microscope, having:
an electron gun for emitting an electron beam;
a pulsed electron formation unit for intermittently irradiating the electron beam;
a pulsed electron control unit for setting an intermittent condition for intermittently irradiating the pulsed electron;
a deflector for controlling an irradiation position of the pulsed electron;
an electron optical system for focusing and irradiating the pulse electron onto a sample;
a sample holder for holding the sample;
a detector for detecting an electron emitted from the sample;
a detection control unit for controlling a detection timing and a detection time of the detector;
an image formation unit for forming an image from a signal of the electron detected by the detector and data on the irradiation position; and an image display unit for displaying the image obtained by the image formation unit, wherein the pulsed electron control unit sets a predetermined time for which a region which is planned to be observed of the sample is irradiated with the electron beam, an irradiation frequency and an inter-irradiation interval time, and the detection control unit sets a detection time which is shorter than the predetermined irradiation time within the set predetermined irradiation time.

17. The electron microscope according to claim 16, wherein the detection control unit controls pluralities of detection timings and detection times of the detector, having a signal storage unit for storing signals of electrons which have been detected at the plurality of timings into a plurality of storage units, and in the image formation unit, a plurality of images are formed from the signal and the irradiation position.

18. The electron microscope according to claim 16, further having:

an irradiation system for radiating the irradiation position of the pulsed electron with an intermittent energy line, wherein the pulsed electron control unit controls an irradiation condition of the energy line on the basis of the intermittent condition.

19. The electron microscope according to claim 16, further having:

an electrode unit disposed facing an interface of the sample to be radiated with the electron beam to control an electric field from the sample, wherein a course of an electron emitted from the sample is controlled in accordance with a polarity to be applied to the electrode unit.

* * * * *